United States Patent
Miyake et al.

(10) Patent No.: US 6,605,870 B2
(45) Date of Patent: Aug. 12, 2003

(54) PRESSURE-CONTACT TYPE SEMICONDUCTOR DEVICE

(75) Inventors: Eitaro Miyake, Hino (JP); Satoshi Yanagisawa, Kawasaki (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/774,610

(22) Filed: Feb. 1, 2001

(65) Prior Publication Data

US 2001/0011757 A1 Aug. 9, 2001

(30) Foreign Application Priority Data

Feb. 7, 2000 (JP) .......................... 2000-29569
Jan. 25, 2001 (JP) .......................... 2001-17405

(51) Int. Cl.$^7$ .................. H01L 23/52; H01L 23/34; H01L 23/48
(52) U.S. Cl. ................. 257/724; 257/150; 257/698; 257/182
(58) Field of Search ................ 257/724, 150, 257/698, 182

(56) References Cited

U.S. PATENT DOCUMENTS 5,708,299 A   1/1998  Teramae et al. ............ 257/727
6,200,407 B1 * 3/2001  Wieloch et al.
6,303,974 B1 * 10/2001 Irons et al. ................. 257/584

FOREIGN PATENT DOCUMENTS

JP   8-330338   12/1996
JP   9-321293   12/1997

* cited by examiner

Primary Examiner—Jerome Jackson
(74) Attorney, Agent, or Firm—Finnegan, Henderson, Farabow, Garrett & Dunner, L.L.P.

(57) ABSTRACT

A pressure-contact type semiconductor device comprises a plurality of semiconductor elements (IGBTs) which are in pressure contact with one another, and in which first main electrodes are electrically connected to a first common main power source plate (pressure-contact type emitter electrode plate), and second main electrodes are electrically connected to a second common main power source plate (pressure-contact type collector electrode). The pressure-contact type semiconductor device also includes a common control signal board which is constituted by a printed circuit board or a multi-layered printed circuit board, and extends over spaces between rows of semiconductor elements, thereby forming a path for sending a control signal.

39 Claims, 13 Drawing Sheets

*RELATED ART*

*RELATED ART*

PRESSURE-CONTACT TYPE SEMICONDUCTOR DEVICE

CROSS-REFERENCE TO RELATED APPLICATION

This application claims benefit of priority under 35 USC § 119 to Japanese Patent Application No. 2000-29569, filed on Feb. 7, 2000, and Japanese Patent Application No. 2001-17405, filed on Jan. 25, 2001, the entire contents of which are incorporated by reference herein.

BACKGROUND OF THE INVENTION

1. Field of the Invention

The present invention relates to a pressure-contact type semiconductor device, and more particularly relates to a pressure-contact type semiconductor device which is of a multiple chip module structure and includes a plurality of semiconductor elements. Further, the invention relates to technology which is applicable to a pressure-contact type semiconductor device for controlling vehicle motors, power sources and so on.

2. Description of the Related Art

A pressure-contact type semiconductor device used for power source control is mainly constituted by semiconductor elements such as insulating gate bipolar transistors (called "IGBT") which function as a power device. In order to increase a current capacity, such a pressure-contact type semiconductor device employs a multiple chip module structure in which a plurality of semiconductor elements are electrically connected in parallel.

Referring to FIG. 12 of the accompanying drawings, a popular pressure-contact type semiconductor device 100 includes a plurality of semiconductor elements 103A to 103I arrayed in a circular pressure-contact type enclosure 101. Each of the semiconductor elements 103A to 103I is a semiconductor chip made of a single crystal substrate 103s as shown in FIG. 13. An IGBT is mounted on each semiconductor chip. Further, each of the semiconductor elements 103A to 103I is provided with an emitter electrode 103e and a gate electrode 103g on a front surface, and a collector electrode 103c on a rear surface.

Although not shown, the semiconductor elements 103A to 103I are arranged on a common collector electrode plate and include a common emitter electrode plate positioned thereon. The collector electrodes 103c are electrically connected to a collector electrode plate in order that a collector current flows from the collector electrode plate to the collector electrodes 103c. The emitter electrodes 103e are electrically connected to an emitter electrode plate in order to supply an emitter current to the emitter electrode plate.

The gate electrodes 103g are electrically connected to a gate terminal 104 provided at a part of the peripheral edge of the enclosure 101, using gate lead wires 105 extending in the enclosure 101.

In the foregoing pressure-contact type semiconductor device 100, distances between the gate electrodes 103g and the gate terminal 104 vary with the positions of the gate electrodes 103g in the enclosure 101, which means that the gate lead wires 105 have different lengths for connecting to the gate electrodes 103g. As a result, there are different wiring resistances and different inductances which would cause "current apportionment oscillation phenomenon" and lead to malfunction of the pressure-contact type semiconductor device 100 when IGBTs are turn-off time.

The pressure-contact type semiconductor device 200 shown in FIG. 14 has been designed in order to overcome the technical problem of the semiconductor device 100 of FIG. 12, and is provided with the gate ring 106 around the inner peripheral edge of the enclosure 101. The sectional area of the gate ring 106 is larger than that of the gate lead wires 105. The gate ring 106 is partially electrically connected to the gate terminal 104. The gate electrodes 103g of the semiconductor elements 103A to 103I are electrically connected to the gate ring 106 using shortest gate lead wires 107 as possible. The gate ring 106 and gate lead wires 107 are connected using a Pb—Sn solder 108.

Further, Japanese Patent Laid-Open Publications No. 8-330338 and No. 9-321293 disclose the pressure-contact type semiconductor devices.

The pressure-contact type semiconductor device 200 of FIG. 14 seems to suffer from the following problems.

(1) The gate ring 106 has the sectional area which is larger than that of the gate lead wires 107, so that it has been expected that dispersion of the wiring resistances and inductances can be reduced. However, the gate electrodes 103g of the semiconductor elements 103A to 103I should be connected to the gate ring 106 using the gate lead wires 107. The lengths of the gate lead wires 107 vary with the positions of the semiconductor elements 103A to 103I. For instance, the length of the gate electrode 103g of the semiconductor element 103E at the center of the enclosure 101 is approximately twice the length of the gate lead wire 107 for the gate electrode 103g of the semiconductor element 103A near the peripheral edge of the enclosure 101. Therefore, it is very difficult to sufficiently reduce the dispersion of the wiring resistances and inductances in a gate voltage supplying path, and to reliably protect the pressure-contact type semiconductor device 200 against malfunction.

(2) The gate ring 106 and gate lead wires 107 are manually connected using the solder 108 but not automatically. Therefore, the pressure-contact type semiconductor device 200 is assembled with reduced workability, which would increase manufacturing cost and product cost.

(3) Further, the pressure-contact type semiconductor device 200 has a large current capacity and produces large calories, so that it is easily affected by heat or mechanical stress. Such stress concentrates on the solder 108 via which the gate ring 106 and gate lead wires 107 are connected, so that the solders 108 will be easily broken down or peel off.

(4) Still further, the pressure-contact type semiconductor device 200 includes many conductive components such as the gate ring 106 and gate lead wires 107, and many insulating films for insulating the conductive components, and so on. This not only complicates the structure of the semiconductor device but also increases manufacturing and product costs.

SUMMARY OF THE INVENTION

The invention has been contemplated in order to overcome the foregoing problems of the related art, and provides a pressure-contact type semiconductor device which can assure reliable circuit operation of a plurality of semiconductor elements, prevent malfunction and improve electrical reliability.

A further object of the invention is to provide a pressure-contact type semiconductor device which can be made compact by effectively using spaces between rows of semiconductor elements, in addition to the foregoing advantages.

It is a still further object of the invention to provide a pressure-contact type semiconductor device which can be efficiently and reliably assembled.

A final object of the invention is to provide a pressure-contact type semiconductor device which can reduce manufacturing and product costs through efficient and reliable assembling.

According to a first feature of the invention, there is provided a pressure-contact type semiconductor device comprising: a plurality of semiconductor elements each of which has a first main electrode and a control electrode positioned on a front surface and a second main electrode positioned on a rear surface; a second common main power source plate having the semiconductor elements on a front surface and electrically connected to the second main electrodes; a first common main power source plate arranged on the front surface of the semiconductor elements and electrically connected to the first main electrodes of the semiconductor elements; and a common control signal board arranged between rows of the semiconductor elements and electrically connected to the control electrodes of the semiconductor elements.

The semiconductor element is preferably an IGBT, a MOSFET (metal oxide semiconductor field effect transistor), a SIT (static induction transistor), a BJT (bipolar transistor), a SI thyristor (static induction thyristor), a GTO thyristor, an IEGT (injection enhanced gate transistor) and so on.

Specifically, the first main electrode is either an anode region or a cathode region in the SI thyristor or GTO thyristor, either an emitter region or a collector region in the BJT or IGBT, and either a source region or a drain region in the MOSFET or SIT. The second main electrode is either the anode or cathode region which does not function as the first main electrode in the SI thyristor or GTO thyristor, either the emitter or collector region which does not function as the first main electrode in the BJT or IGBT, and either the source or drain region which does not function as the first electrode in the MOSFET or SIT. In other words, in the SI thyristor or GTO thyristor, when the first main electrode is the anode region, the second main electrode is the cathode region. In the BJT or IGBT, when the first main electrode is the emitter region, the second main electrode is the collector region. In the MOSFET or SIT, when the first main electrode is the source region, the second main electrode is the drain region.

The control electrode denotes a gate electrode in the IGBT, MOSFET, SIT and so on while it denotes a base electrode in the BJT.

The common control signal board provides the control electrodes of the semiconductor elements with a control signal, and is made of at least a plate having appropriate rigidity, a thin flexible film or the like. The common control signal board is preferably provided between the rows of semiconductor elements without being in contact with them, i.e. the signal board is insulated from the semiconductor elements. Further, the common control signal board includes at least conductors, each of which has a cross sectional area larger than the cross sectional area of the gate lead wire of the pressure-contact type semiconductor device 100 shown in FIG. 12, or the cross sectional area of the gate lead wire 107 of the semiconductor device 200 shown in FIG. 14.

In the foregoing pressure-contact type semiconductor device, the common control signal board is in the shape of a mesh sheet and has electrode openings for the semiconductor elements.

The common control signal board extends substantially all over the spaces between the rows of semiconductor elements. This is effective in reducing and unifying wiring resistance and inductance in a route through which the control signal is transmitted. Therefore, it is possible to assure reliable operation of the semiconductor elements and reduce malfunction thereof, which enables the semiconductor device to be electrically reliable. Further, the pressure-contact type semiconductor device can be made compact by efficiently using the spaces between the rows of semiconductor elements for the common control signal board.

In accordance with a second feature of the invention, the common control signal board is a printed circuit board having insulating films and conductive films formed on the insulating films. The printed circuit board may be a multiple-layered printed circuit board in which the insulating films and conductive films are alternately layered. Therefore, the common control signal board is assembled in the semiconductor device as one unit. It is possible to reduce manufacturing and product costs of the pressure-contact type semiconductor device. Further, the control signal board is constituted by the insulating films and thin conductive films, and the insulating films can isolate the semiconductor elements, and the semiconductor elements from the thin conductive films, without using any additional insulating films. This is effective in reducing the number of components. Further, the insulating films and thin conductive films are integral and form a printed circuit board or a multi-layered printed circuit, which simplifies the internal structure of the pressure-contact type semiconductor device.

According to a third feature of the invention, the pressure-contact type semiconductor device further includes control signal probes for electrically connecting the thin conductive films of the common control signal board and the control electrodes of the semiconductor elements. The control signal probe and control electrodes are preferably in electric contact with one another.

The foregoing structure is effective in improving ease of assembly of the components and reliability of the assembling work. Especially, since no soldering work is performed, ease of assembly can be extensively improved and assembly work can be automatically carried out.

In accordance with a fourth feature, the foregoing pressure-contact type of semiconductor device further comprises a gate terminal for electrically connecting the thin conductive films of the common control signal board and an external device. The gate terminal has one end thereof connected to the external device and includes at the other end thereof a plurality of branched control signal leads electrically connected in parallel. The branched control signal leads are provided with pins for electrical connection with the thin conductive films of the common control signal board.

The branched common control leads of the gate terminal are effective in reducing the inductance. Further, the branched control signal leads are provided with a plurality of portions for connection with the common control signal boards. This structure is also effective in reducing the inductance and increasing a current capacity.

DESCRIPTION OF THE PREFERRED EMBODIMENT

The invention will be described with reference to one embodiment shown in the accompanying drawings. In this embodiment, a pressure-contact type semiconductor device 1 has a multiple chip module structure in which IGBTs are used as semiconductor elements and are arranged in rows.

[Overall Configuration of Pressure-Contact Type Semiconductor Device]

Figure 1:
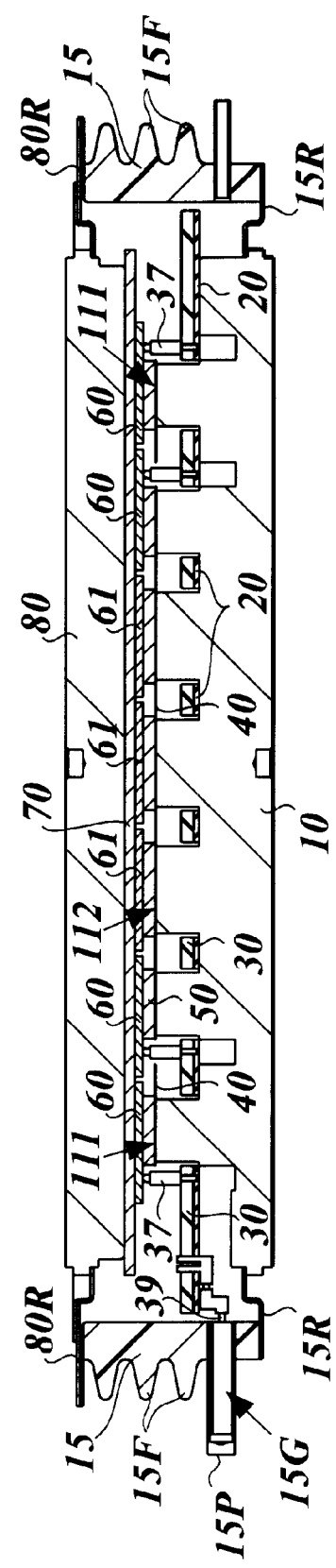
FIG. 1 is a cross section of a pressure-contact type semiconductor device according to one embodiment of the invention.
Figure 2:
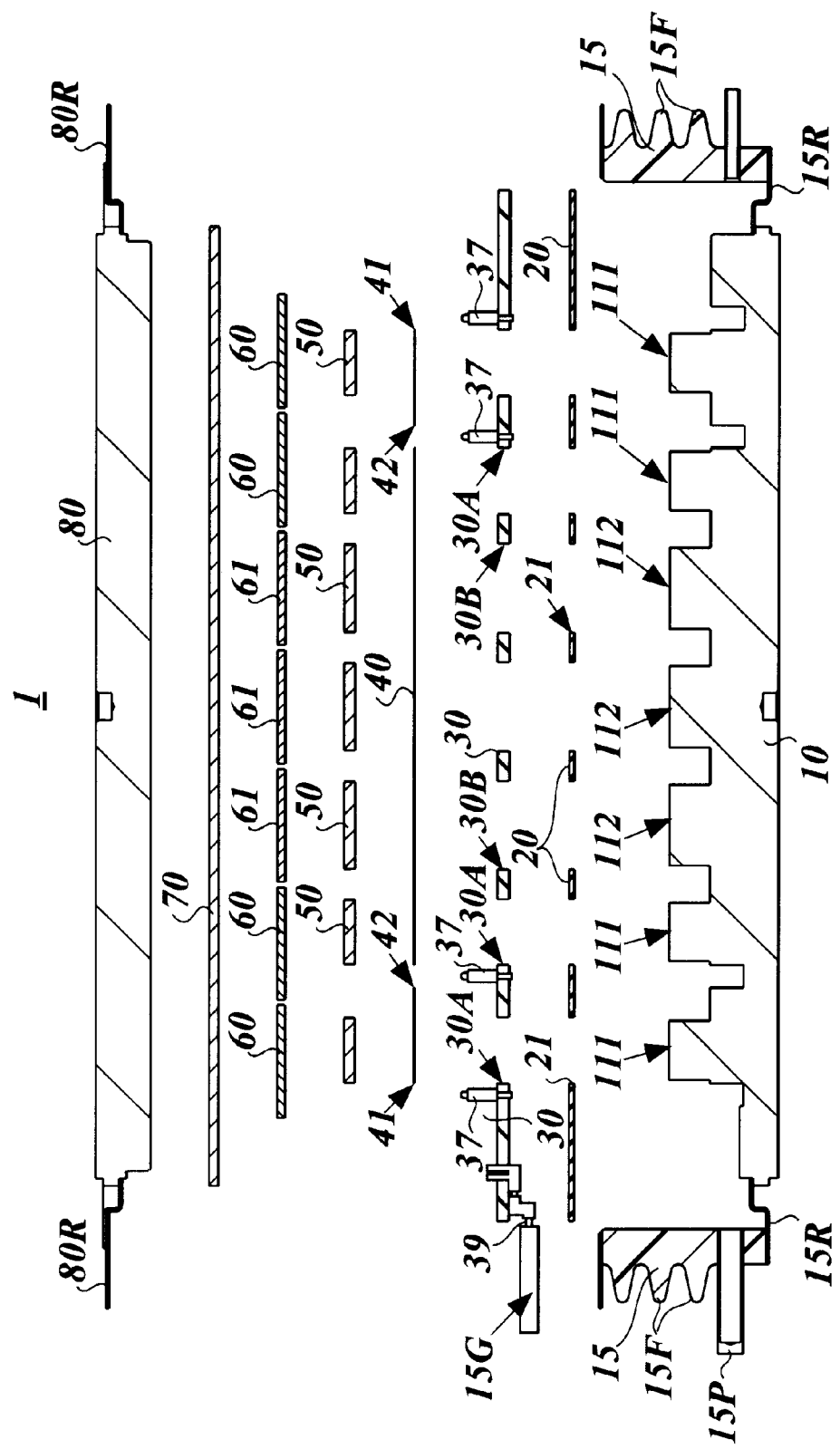
FIG. 2 is an exploded cross section of components constituting the pressure-contact type semiconductor device.
Figure 3:
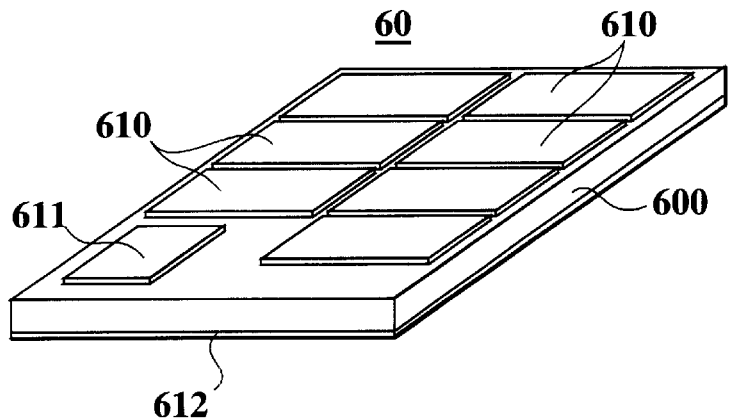
FIG. 3 is a perspective view of semiconductor elements of the pressure-contact type semiconductor device.

Referring to FIG. 1 to FIG. 3, the pressure-contact type semiconductor device 1 comprises: a plurality of semiconductor elements 60, each of which has a first main electrode 610, and a control electrode 611, and a second main electrode 612 on front and rear surfaces thereof, respectively; a second common main power source plate (a pressure-contact collector electrode plate) 80 that has the semiconductor elements 60 positioned on the front surface thereof and is electrically connected to the second main electrodes 612 of the semiconductor elements 60; a first common main power source plate (a pressure-contact emitter electrode) 10 provided on the front surfaces of the semiconductor elements 60 and electrically connected to the first main electrodes 610 of the semiconductor elements 60; and a common control signal board 30 provided between rows of the semiconductor elements 60 and electrically connected to the control electrodes 611 of the semiconductor elements 60.

Referring to FIG. 3, each semiconductor element 60 has the first main electrode 610 and the control electrode 611 on the front surface thereof (at the upper side in FIG. 3), and the second main electrode 612 on the rear surface thereof (at the lower side in FIG. 3). The semiconductor elements 60 are assembled in a face-down state into the pressure-contact type semiconductor device 1. The first common main power source plate 10, which is shown at the lower side in FIG. 1 and FIG. 2, is positioned on the front surface of the semiconductor elements 60 while the second common main power source plate 80, which is shown at the upper side in these drawing figures, is positioned on the rear surface of the semiconductor elements 60.

Further, the pressure-contact type semiconductor device 1 includes at least an enclosure 15, a spacer 20, a conductive metal sheet 40, a plurality of first heat buffer plates 50, a plurality of semiconductor elements 61, and a second heat buffer plate 70.

[Structure of Semiconductor Element (IGBT)]

Figure 4:
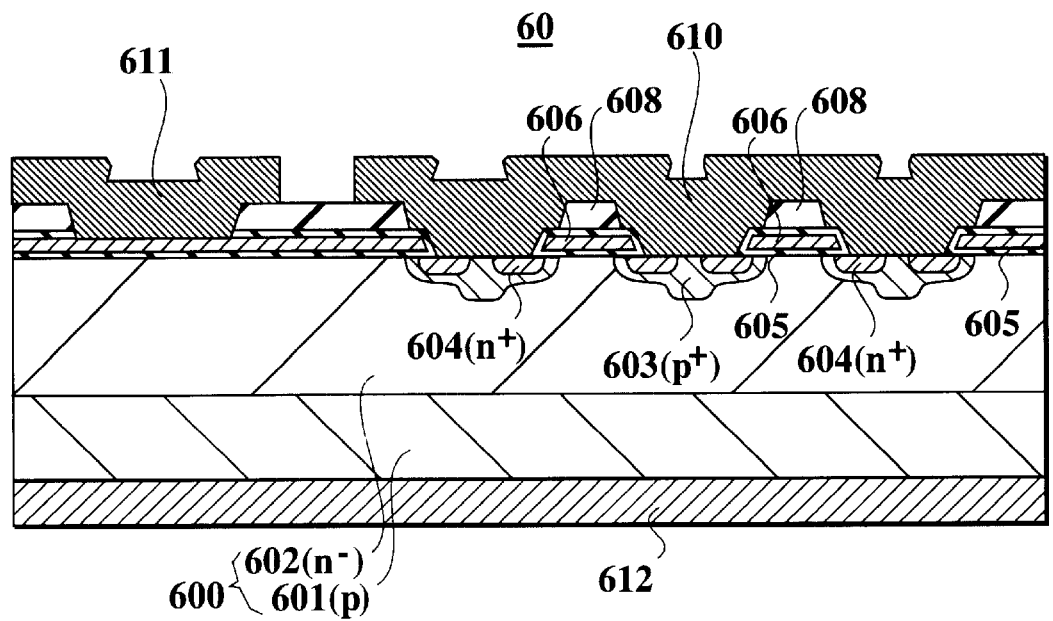
FIG. 4 is a cross section of the essential parts of the semiconductor elements.

Referring to FIG. 3 and FIG. 4, the semiconductor element 60 is an IGBT, which can withstand high voltages, have a large capacity, and perform high speed switching operation. Specifically, the semiconductor element 60 is formed by a crystal single silicon substrate 600, the IGBT is loaded into the crystal single silicon substrate 600.

Each the IGBT includes: an n-type emitter region 604 which has a high impurity concentration and is used as the first main electrode region; a p-type collector region 601 which has a low impurity concentration and is used as the second main electrode region; and a gate electrode 606, a p-type base region 603 having a high impurity concentration, and an n-type base region 602 having a low impurity concentration, all of which are used as a control electrode region.

The p-type collector region 601 is positioned on the rear surface of the crystal single silicon substrate 600 while the n-type base region 602 is on the front surface of the crystal single silicon substrate 600. The p-type collector region 601 may have a high impurity concentration. The p-type base region 603 is positioned on the main surface of the n-type base region 602. The n-type emitter region 604 is positioned on the main surface of the p-type base region 603. The gate electrode 606 is made of a polycrystalline silicon film, for example, and is positioned on the front surface of the crystal single silicon substrate 600 via the gate insulating film 605. The gate insulating film 605 is made of a silicon oxide film or a silicon nitride film, for example. The IGBT is constituted by a plurality of minute IGBT cells which are arranged in the shape of a matrix and are electrically connected in parallel.

In the IGBT, the first main electrode (emitter electrode) 610 is electrically connected to the n-type emitter region (the first main electrode region) 604. The control electrode 611 is electrically connected to the gate electrode (control electrode region) 606. The second main electrode (collector electrode or rear electrode) 612 is electrically connected to the p-type collector region (second main electrode region) 601. The first main electrode 610 and the control electrode 611 are positioned on the same conductive layer (on the same surface) of the crystal single silicon substrate 600 via an interlayer insulating film 608, and are made of the same conductive material such as an aluminum (Al) film or an aluminum alloy (Al—Si, Al—Cu, Al—Cu—Si or the like) film which has an excellent conductivity. On the other hand, the second main electrode 612 extends almost over the rear surface of the crystal single silicon substrate 600, and is made of a material such as an aluminum film or an aluminum alloy film having an excellent conductivity.

Although not shown, the semiconductor elements 61 are in the shape of a Free Wheel Diode (FWD), and are provided with electrodes (not shown) on the front and rear surfaces thereof.

[Structure of First Common Main Power Source Plate]

Referring to FIG. 1 and FIG. 2, in the pressure-contact type semiconductor device 1, the first common main power source plate 10 is in the shape of a disc, and functions not only as a common main electrode for the semiconductor elements 60 and 61 but also as a radiator for radiating heat produced by the semiconductor elements 60 and 61.

The first common main power source plate 10 is made of a metallic material such as a copper (Cu) plate, a copper alloy plate or the like having excellent electric conduction and heat transfer. The first and second gibbosity electrodes 111 and 112 are integral. The first common main power source plate 10 itself is preferably formed by machining (mechanical cutting).

When viewed from above, each first gibbosity electrode 111 is substantially square similarly to the first main electrode 610 of the semiconductor element 60, and is cut away at one corner thereof in order to provide a space for the control electrode 611. Further, each second gibbosity electrode 112 is substantially square similar to the semiconductor element 61.

The first common main power source plate 10 is made of a metallic material such as a copper (Cu) plate, a copper alloy plate or the like having excellent electric conduction and heat transfer. The first and second gibbosity electrodes 111 and 112 are integral. The first common main power source plate 10 itself is preferably formed by machining (mechanical cutting).

[Structure of Enclosure]

Figure 5:
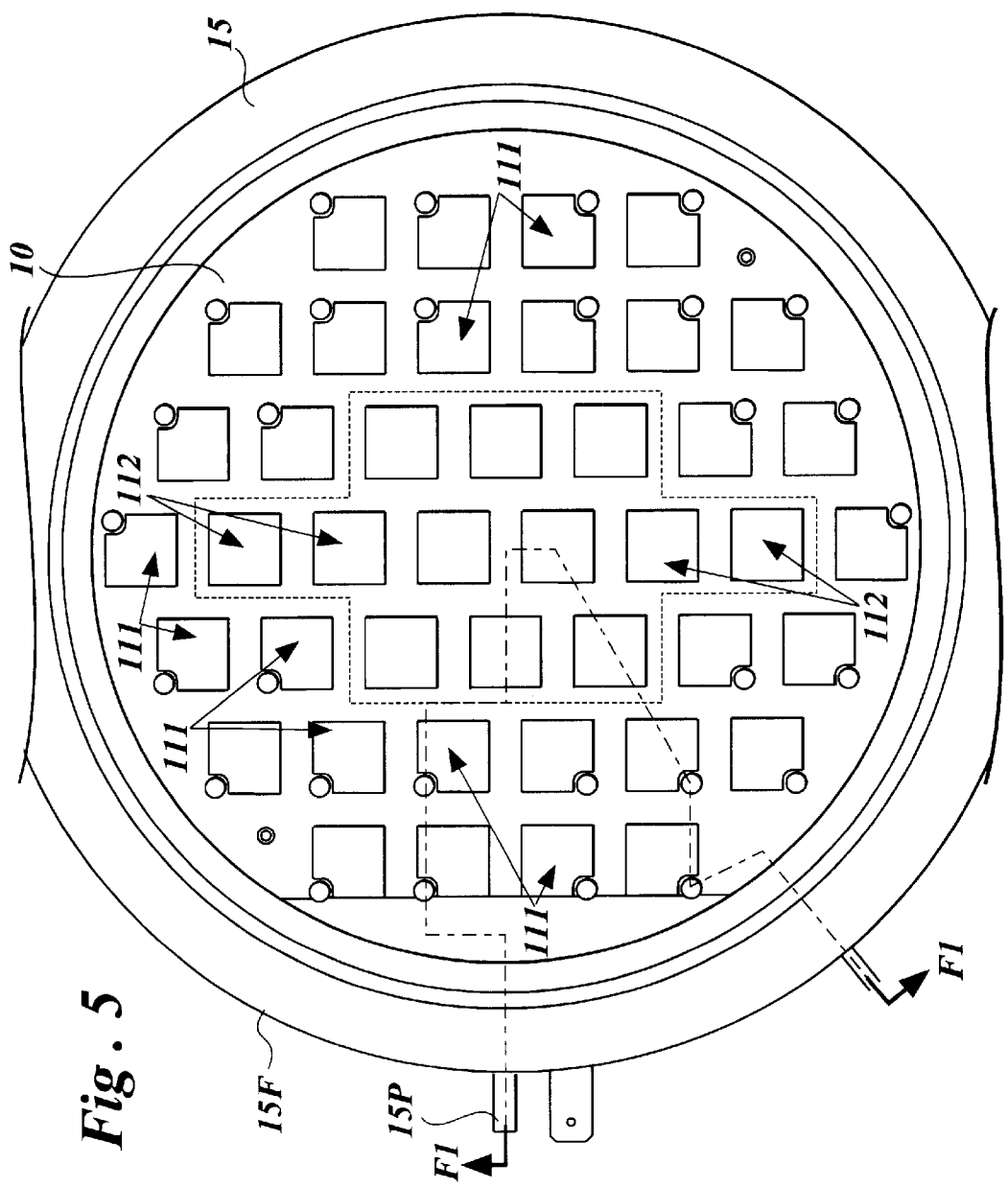
FIG. 5 is a plan view of a first common main power source plate of the pressure-contact type semiconductor device.

As shown in FIGS. 1, 2 and 5, a cylindrical enclosure 15 is attached around the first common main power source plate 10 via a metal ring frame 15R. The cylindrical enclosure 15 has an uneven surface 15F in order to increase a surface area thereof The uneven surface 15F is effective in increasing a surface distance between the cylindrical enclosure 15 and the first and second common main power source plates 10 and 80, preventing current flow between the first and second common main power source plates 10 and 80, and improving insulation resistance.

Referring to FIG. 1 and FIG. 2, the first and second common main power source plates 10 and 80 are attached to the lower and upper ends of the cylindrical enclosure 15, respectively. The cylindrical enclosure 15 is made of a material such as ceramics that have mechanical strength and good insulation resistance. Further, the cylindrical enclosure 15 has a gate terminal 15G in order to provide the control electrodes 611 of the semiconductor elements 60 with a control signal (a gate voltage) as will be described later.

In this embodiment, the cylindrical enclosure 15 has an outer diameter of 155 mm to 165 mm, an inner diameter of 135 mm to 145 mm, and a height of 23 mm to 25 mm. However, the size of the enclosure 15 is not always limited to the foregoing values.

[Structure of Spacer]

The common control signal board 30 is assembled in the cylindrical enclosure 15 with a spacer 20 arranged therebetween as shown in FIG. 1 and FIG. 2.

Figure 6:
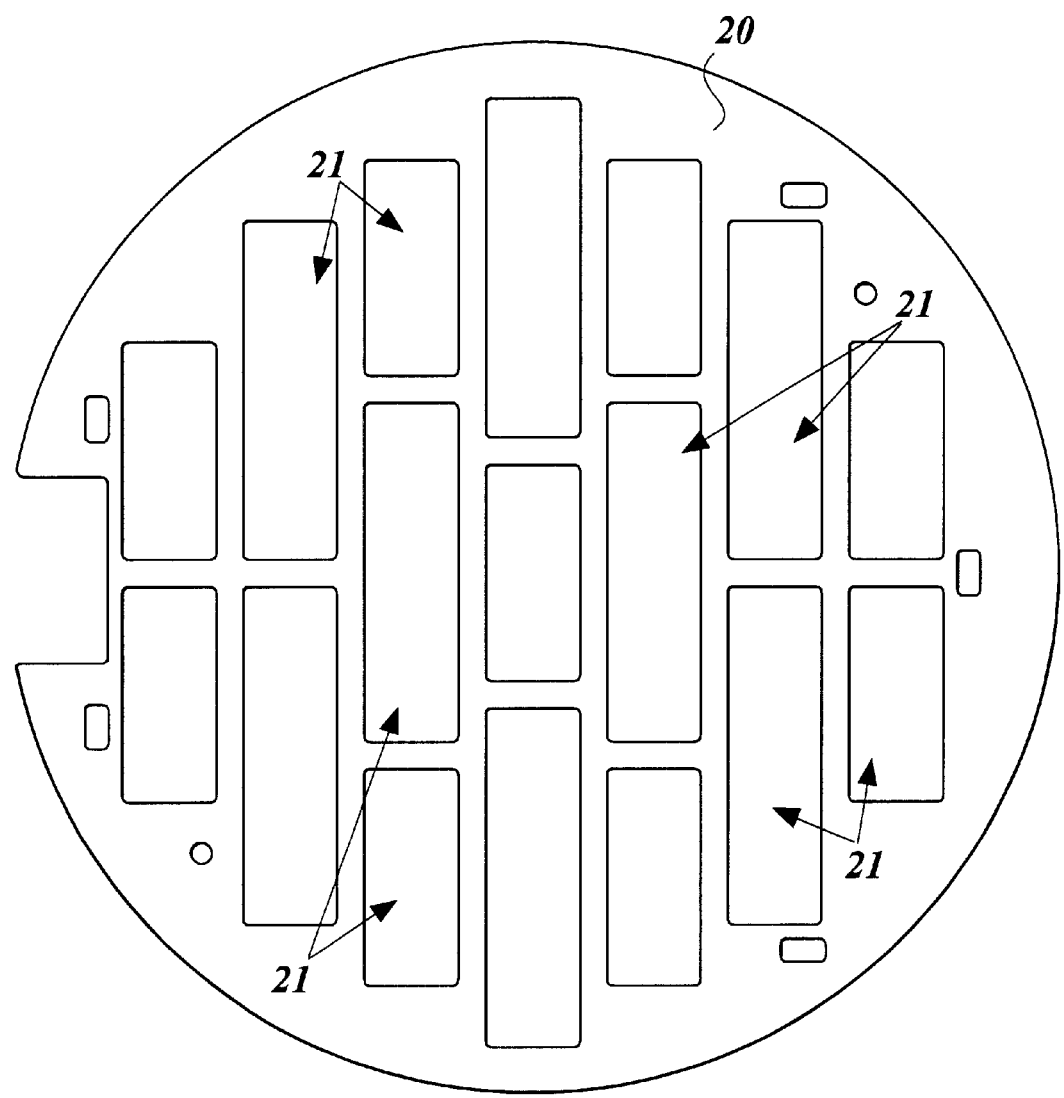
FIG. 6 is a plan view of a spacer of the pressure-contact type semiconductor device.

The spacer 20 electrically insulates the first common main power source plate 10 at the lower side from the common control signal board 30 at the upper side, as shown in FIGS. 1, 2 and 6.

The spacer 20 is in the shape of a disc similarly to the first common main power source plate 10, and has first openings 21 through which the first and second gibbosity electrodes 111 and 112 project. Each of the first openings 21 is rectangular and enables two or three first or second gibbosity electrodes 111 or 112 to pass therethrough.

The spacer 20 is made of a resin material such as silicone resin or polyether-imide which has at least electrical insulation.

[Structure of Common Control Signal Board]

Figure 7:
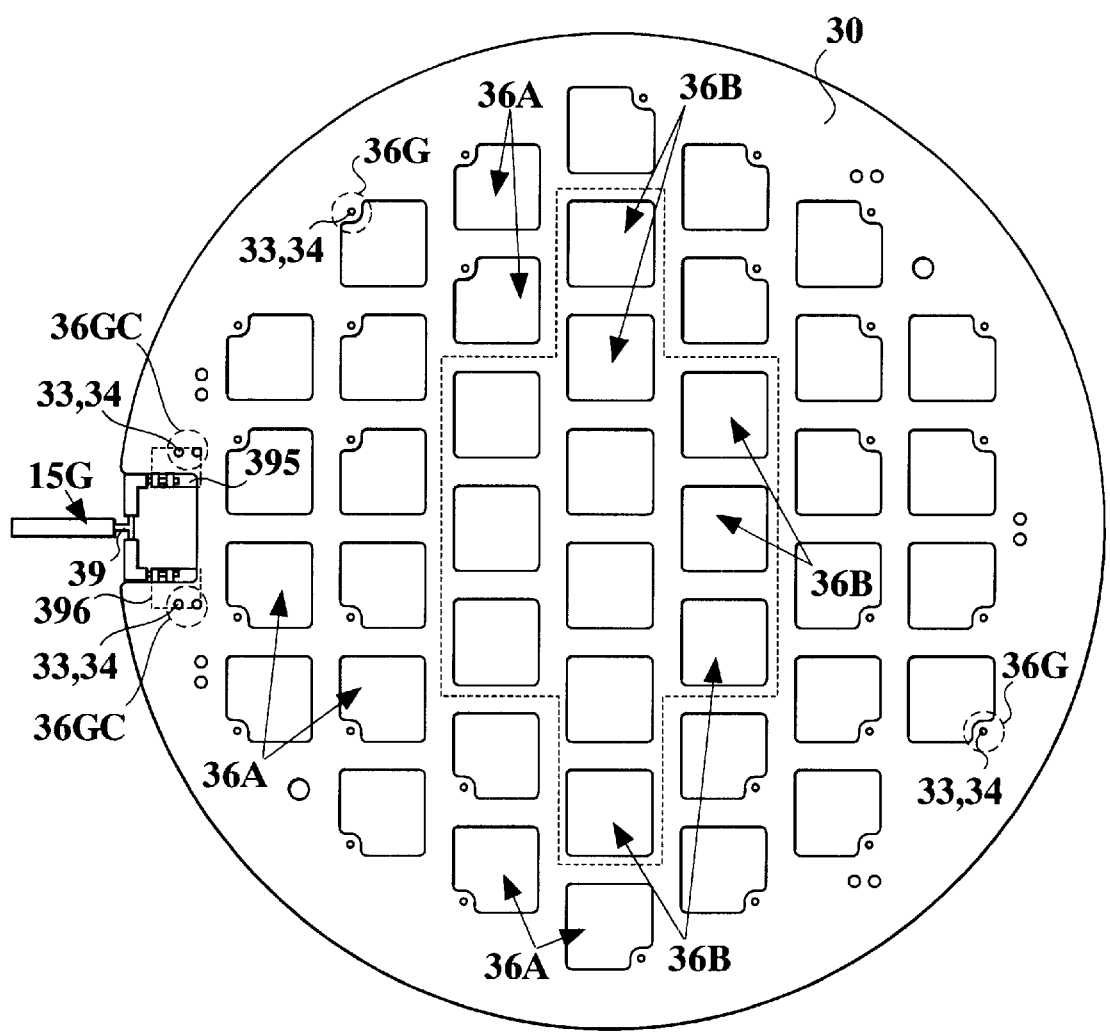
FIG. 7 is a plan view of a common control signal board of the pressure-contact type semiconductor device.

Referring to FIGS. 1, 2 and 7, the common control signal board 30 provides the control electrodes 611 of the semiconductor elements 60 with the control signal (gate voltage).

The common control signal board 30 is made of a multi-layered printed circuit board in the shape of a mesh sheet, and has second electrode openings 36A and 36B for the semiconductor elements (IGBT) 60 and the semiconductor elements (FWD) 61, respectively.

When viewed from above, the second openings 36A are shaped similarly to the first gibbosity electrodes 111 which pass therethrough, but are slightly larger than the latter. Each second electrode opening 36A has a projecting portion 36G in order to electrically connect the common control signal board 30 to the control electrodes 612 of the semiconductor elements 60. The through-holes 33 and through-hole wirings 34 are provided in the projecting portions 36G (see FIG. 7 and FIG. 8(A)).

The second electrode openings 36B are shaped similarly to the second gibbosity electrodes 112 which pass therethrough, but are slightly larger than the latter.

Figure 8:
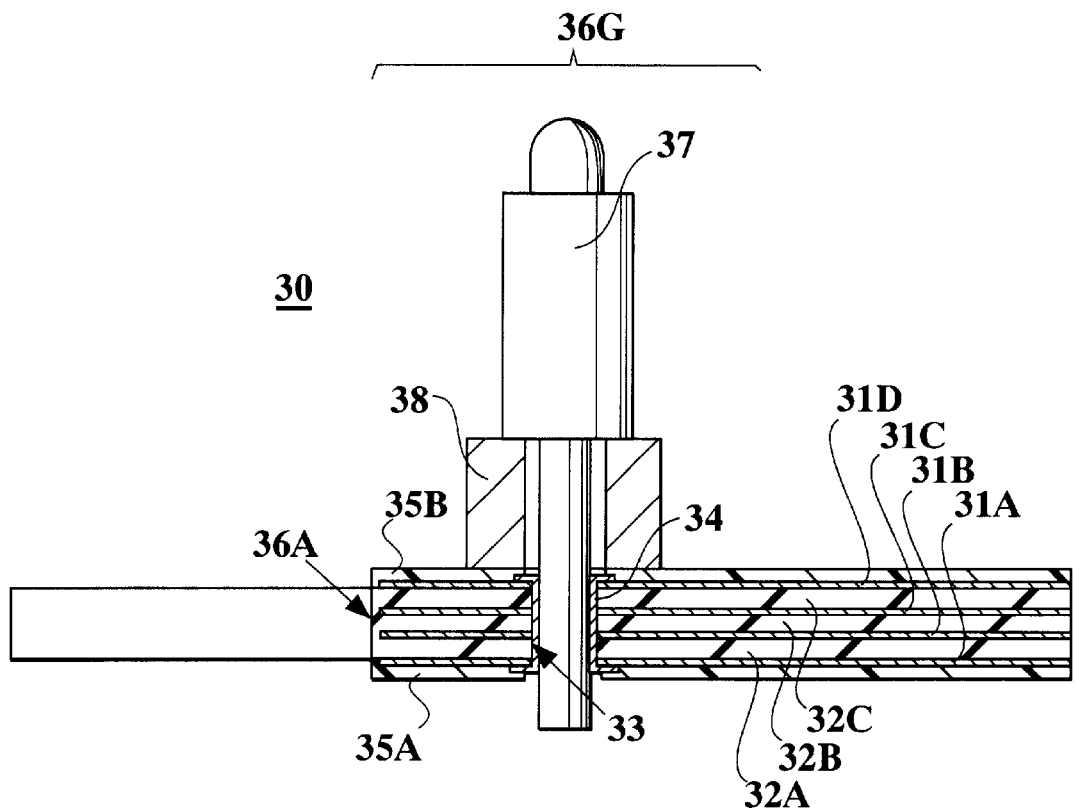
FIG. 8(A) is an enlarged cross section of the essential parts of the common control signal board of FIG. 7.
FIG. 8(B) is a plan view of a control terminal (gate terminal) of the pressure-contact type semiconductor device.
FIG. 8(C) is a side elevation of the control terminal, viewed from the direction F8C in FIG. 8(B).
FIG. 8(D) is a side elevation of the control terminal, viewed from the direction F8D in FIG. 8(B).
Figure 8:
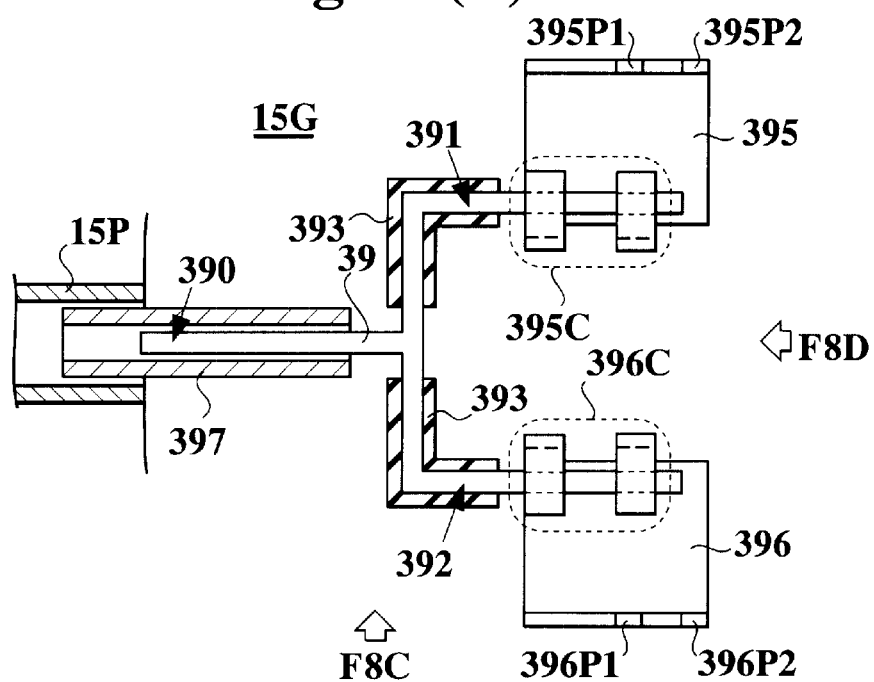
Figure 8:
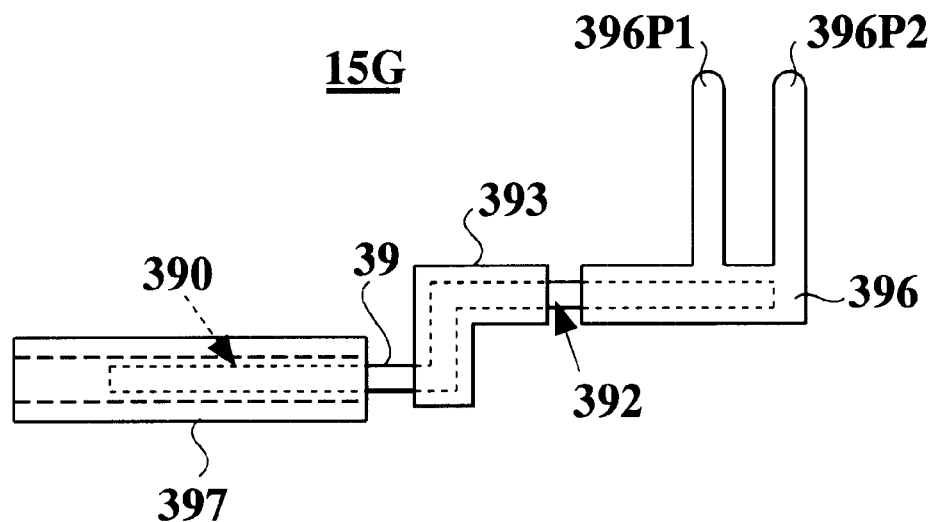
Figure 8:
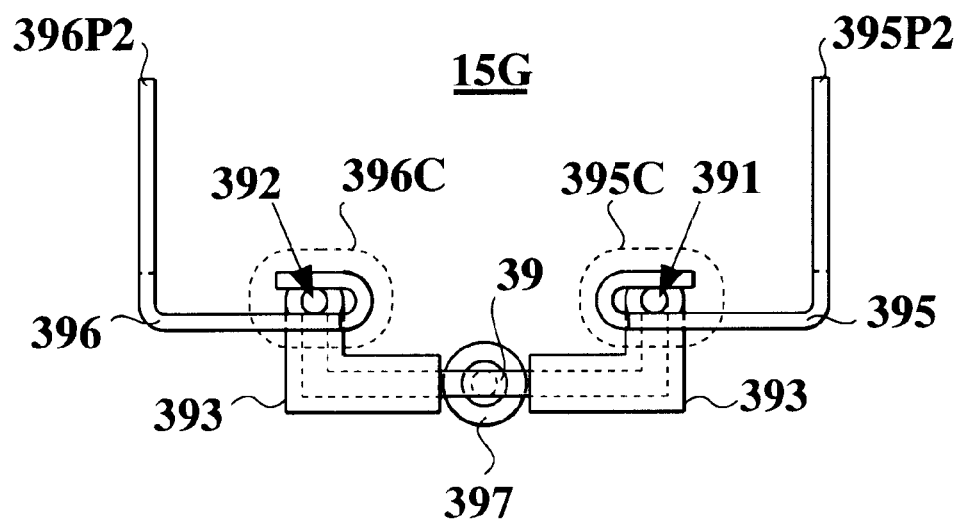

As shown in FIG. 8(A), the common control signal board 30 includes not only an insulating film 32A but also a thin conductive film 31B, an insulating film 32B, a thin conductive film 31C and an insulating film 32C which are layered one over the other on the front surface of the insulating film 32A. Further, a thin conductive film 31A is provided on the rear surface of the insulating film 32A. The insulating films 32A and 32C are preferably made of glass epoxy resin. The insulating film 32B is preferably made of glass epoxy resin, silicon oxide film or the like. The thin conductive films 31A to 31D are preferably made of thin films such as thin copper films or thin copper alloy films which have excellent electric conduction and heat transfer.

The thin conductive films 31A and 31D are preferably covered by thin nickel (Ni) films or the like in order to prevent oxidation. Further, in order to prevent short fault with other conductors, solder resist films 35A and 35B respectively cover the thin conductive film 31A on the rear surface of the insulating film 32A, and the thin conductive film 35D atop the insulating film 31C on the front surface of the insulating film 32A.

Each of the thin conductive films 31A to 31D is 60 $\mu$m to 80 $\mu$m thick, so that a total thickness of these films can be increased. The thickness of these thin conductive films 31A to 31D is not limited to the foregoing values. The thin conductive films 31A to 31D are electrically connected one another via the through-holes 33 formed through the common control signal board 30, and through-hole wirings 34 provided in the through-hole 33. Usually, these thin conductive films 31A to 31D are formed by the sputtering, or by laminating thin films. It is very difficult to extensively thicken a single-layer thin film. Therefore, the common control signal board 30 includes the thin conductive films 31A to 31D in order to increase their effective thickness (i.e. a cross sectional area) by connecting them using the through-hole wirings 34.

Further, the thin conductive films 31A to 31D extend between the semiconductor elements 60 and 61 without being in contact with them (i.e. without causing shorting) in order to increase the cross sectional area of the control signal route. In the pressure-contact type semiconductor device 1, the first and second common main power source plates 10 and 80 sandwich the semiconductor elements 60 therebetween. Therefore, since there is no space for the first and second common main power source plates 10 and 80 on the front and rear surfaces of the semiconductor elements 60, the common control signal board 30 is positioned using free spaces between the semiconductor elements 60 and 61 in order to increase the cross sectional area of the control signal route. The effective thickness of the common control signal board 30 is approximately 1.5 mm to 1.7 mm.

Although not shown, at least one resistance element is necessary for the circuits of the pressure-contact type semiconductor device 1 and is provided by using any of the thin conductive films 31A to 31D, or preferably the uppermost or lowermost thin conductive film 31A or 31D of the common control signal board 30. Such a resistance element is integral with the thin conductive film 31A or 31D (i.e. it can be formed by modifying a flat pattern). This means that the pressure-contact type semiconductor device 1 does not require any solder 108, which is used in the related art in order to connect the gate ring 106 and the gate lead wire 107 functioning as a resistor. In other words, components corresponding to the gate ring 106 and gate lead wire 107 are dispensable from the pressure-contact type semiconductor device 1. Non-necessity of soldering connection between the gate ring 106 and gate lead wiring 107 is effective in extensively improving the assembling work, and enables automatic assembling work.

[Structure of Control Electrode Probe]

Referring to FIG. 8(A), each control electrode probe 37 is provided at each projecting portion 36G (shown in FIG. 7) and extends to the front surface of the common control signal board 30. The control electrode probe 37 has its bottom fitted into the through-hole 33 at the projecting portion 36G, and electrically connected to the through-hole wiring 34. A probe spacer 38 is used between the common control signal board 30 and the control electrode probe 37 in order to adjust a height of the latter.

Each control signal probe 37 has a hemispherical top being in uniform contact with the control electrode 611 of the semiconductor element 60, and is electrically connected thereto. Although not shown, the control signal probes 37 have resilient coil springs provided therein, for instance, in order to come into pressure contact with the control electrodes 611. The contact pressure is appropriately controlled by the resilient coil springs. The control electrode probes 37 are made of a conductive material such as copper, a copper alloy, an iron nickel alloy (Fe—Ni) or the like which has excellent conductivity. The control electrode probes 37 made of copper or a copper alloy have preferably their front surfaces nickel-plated.

[Structure of Gate Terminal]

Referring to FIGS. 1, 2 and 7, the gate terminal 15G is provided at least at a part of the peripheral edge of the common control signal board 30, and has one end thereof electrically connected to the thin conductive films 31A to 31D, and the other end thereof connected to an external device. The gate terminal 15G transfers the control signal to the thin conductive films 31A to 31D from the external device.

FIGS. 8(B), 8(C) and 8(D) show that the gate terminal 15G includes at least a lead holding pipe 15P provided in the cylindrical enclosure 15, and a control signal lead 39 which has its one end 390 fitted and held in the lead holding pipe 15P and the other ends 391 and 392 thereof electrically connected to the thin conductive films 31A to 31D.

In this embodiment, one end 390 of the control signal lead 39 is fitted into the lead holding pipe 15P via an intermediate pipe 397, and is axially slidable in the intermediate pipe 397 so that an effective length thereof is adjustable. Therefore, after temporarily attaching the control signal lead 39 to the common control signal board 30, the end 390 can be easily inserted into the lead holding pipe 15P. The intermediate pipe 397 is made of a metallic material such as brass which is highly conductive and easy to machine. The intermediate pipe 397 and the end 390 of the control lead 39 are electrically and mechanically connected using a solder or the like before they are assembled.

The control signal lead 39 has two other ends 391 and 392 branched and electrically connected in parallel. However, the number of these ends is not always limited to two. The more branched ends of the control signal lead 39, the more extensively the inductance can be reduced. The control signal lead 39 is preferably made of a copper lead or the like that has a good conductivity.

The end 391 of the control signal lead 39 is provided with a control signal connector 395 which has connecting pins 395P1 and 395P2, and is electrically connected to the thin conductive films 31A to 31D at the connecting regions 36GC of the common control signal board 30. The end 392 of the control signal lead 39 is provided with a control signal connector 396 which has connecting pins 396P1 and 396P2, and is electrically connected to the thin conductive films 31A to 31D at the connecting regions 36GC of the common control signal board 30.

The control signal connectors 395 and 396 are made of a metal plate such as a copper plate having a good conductivity. The metal plate is shaped as desired by mechanically punching or etching, and is then folded. An end 395C of the common control signal connector 395 is wound around the end 391 of the control signal lead 39, and is clinched and soldered, so that the common control signal lead 39 and the control signal connector 395 are electrically and mechanically connected. The connecting pins 395P1 and 395P2 are inserted into the through-holes 33 at the connecting regions 36GC, and are electrically connected to the through-hole wirings 34. Since the control signal connector 395 and the common control signal board 30 are connected using the connecting pins 395P1 and 395P2, the inductance can be reduced, and sufficient current capacity can be secured. The length of the connecting pins 395P1 and 395P2 is larger than the thickness of the common control signal board 30. This is because the control signal connector 395 can be attached to the common control signal board 30 by inserting the connecting pins 395P1 and 395P2 into the through-holes 33 of the common control signal board 30 via the rear surface thereof, and by folding the ends of the pins 395P1 and 395P2.

A part 396C of the control signal connector 396 is wound around the end 392 of the common control signal lead 39, and is clinched and soldered, so that the common control signal lead 39 is electrically and mechanically connected to the control signal connector 396. The connecting pins 396P1 and 396P2 of the control signal connector 396 are inserted into the through-holes 33 at the connecting region 36GC, and are electrically connected to the through-hole wirings 34. Since the control signal connector 396 and the common control signal board 30 are connected using the connecting pins 396P1 and 396P2, the inductance can be reduced, and sufficient current capacity can be secured. The length of the connecting pins 396P1 and 396P2 is larger than the thickness of the common control signal board 30. This is because the control signal connector 396 can be attached to the common control signal board 30 by inserting the connecting pins 396P1 and 396P2 into the through-holes 33 of the common control signal board 30 via the rear surface thereof, and by folding the ends of the pins 396P1 and 396P2.

A resin tube 393 made of TEFLON or the like is provided in the control signal lead 39 near the center thereof which should be insulated.

[Structure of Conductive Metal Sheet]

Figure 9:
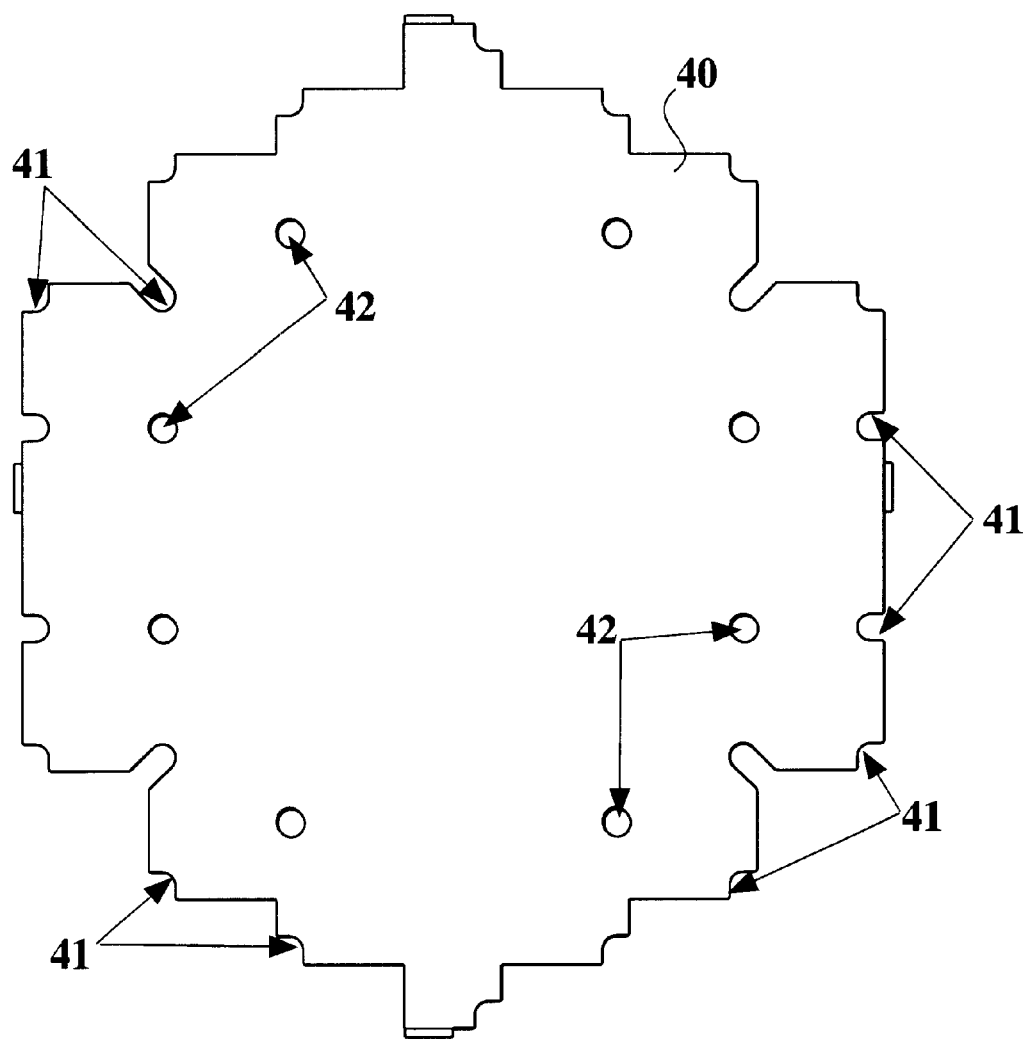
FIG. 9 is a plan view of a conductive metal sheet of the pressure-contact type semiconductor device.
Figure 10:
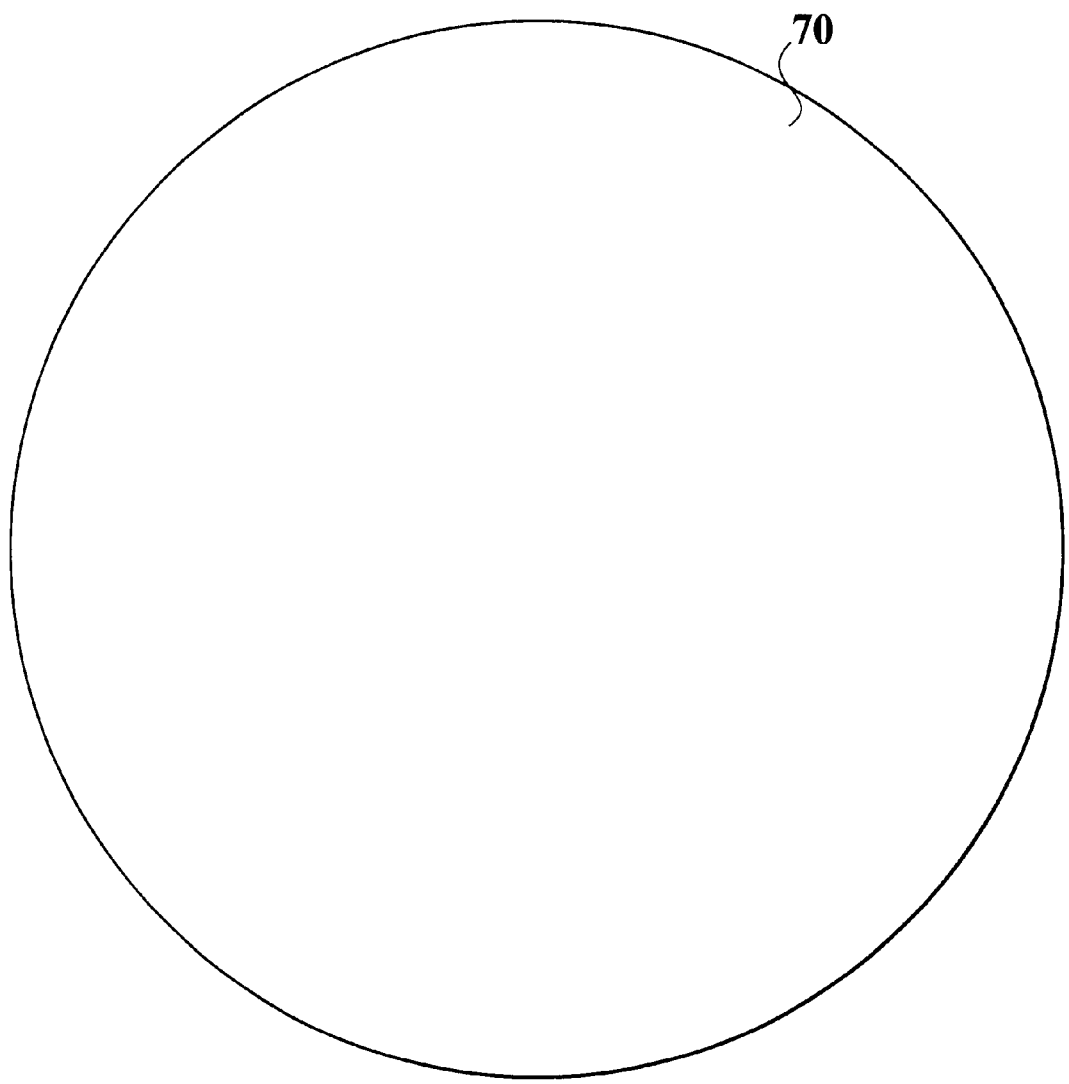
FIG. 10 is plan view of a second heat buffer plate of the pressure-contact type semiconductor device.

Referring to FIGS. 1, 2 and 9, a conductive metal sheet 40 extends over the first and second gibbosity electrodes 111 and 112 of the first common main power source plate 10, i.e. extends over the front surface of the common control signal board 30. The conductive metal sheet 40 is electrically connected to the first main electrodes 610 of the semiconductor elements 60, and can reduce the parasitic impedance between the semiconductor elements 60 and the first main electrodes 610, and prevent oscillations caused by a parasitic LCR oscillator.

The conductive metal sheet 40 is formed with notch members 41 and openings 42 for making the control signal probe 37 to pass through, at regions where the control signal probes 37 are positioned. The conductive metal sheet 40 is made of a conductive metal such as a hard copper plate, a copper alloy plate or the like that is mechanically punched, and is preferably nickel-plated in order to prevent oxidation and corrosion.

The conductive metal sheet 40 is dispensable from the pressure-contact type semiconductor device 1 so long as LCR oscillation conditions do not cause any oscillation.

[Structure of Heat Buffer Plates]

As shown in FIG. 1 and FIG. 2, the semiconductor elements 60 and 61 are arranged on the conductive metal sheet 40 via a plurality of first heat buffer plates 50. Each first heat buffer plate 50 is provided for each of the semiconductor elements 60 and 61 in order to reduce stress which is caused due to a difference of coefficients of thermal expansion of the semiconductor elements 60 or 61 and the conductive metal sheet 40. In other words, the first heat buffer plates 50 are in the shape of a chip whose contour is similar to that of the semiconductor elements 60 or 61, or the first or second gibbosity electrode 111 or 112.

For instance, the first heat buffer plates 50 are made of a 1 mm to 2 mm thick molybdenum (Mo) plate which has a good electrical conduction and a coefficient of thermal expansion that is between a coefficient of thermal expansion of crystal single silicon and that of copper. If the semiconductor elements 60 and 61 are differently thick, the first heat buffer plates 50 will be also used as height adjusting spacers. For instance, if the semiconductor elements 60 are thinner than the semiconductor elements 61, the former will be positioned on thick first heat buffer plates 50 while the latter will be positioned on thin first heat buffer plates 50, thereby making the semiconductor elements 60 and 61 flush with one another.

[Structure of Second Heat Buffer Plate]

As shown in FIG. 1 and FIG. 2, the second main power source plate 80 is provided on the semiconductor elements 60 and 61 via a second heat buffer plate 70. The second heat buffer plate 70 serves for both the semiconductor elements 60 and 61, and differs from the first heat buffer plates 50 in this respect. The second heat buffer plate 70 is in the shape of a disc similarly to the first or second common main power source plate 10 or 80, and functions similarly to the first heat buffer plates 50, i.e. reduces stress which is caused due to a difference of coefficients of thermal expansion of the semiconductor elements 60 or 61 and the second common power source plate 80. The second heat buffer plate 70 is made of a 1 mm to 2 mm thick molybdenum plate which has a good electrical conduction and an appropriate coefficient of thermal expansion.

In this embodiment, the second heat buffer plate 70 is disc shaped. Alternatively, it may be in the shape of a chip whose contour is similar to that of the semiconductor elements 60 or 61, or the first or second gibbosity electrode 111 or 112.

[Structure of Second Common Main Power Source Plate]

Figure 11:
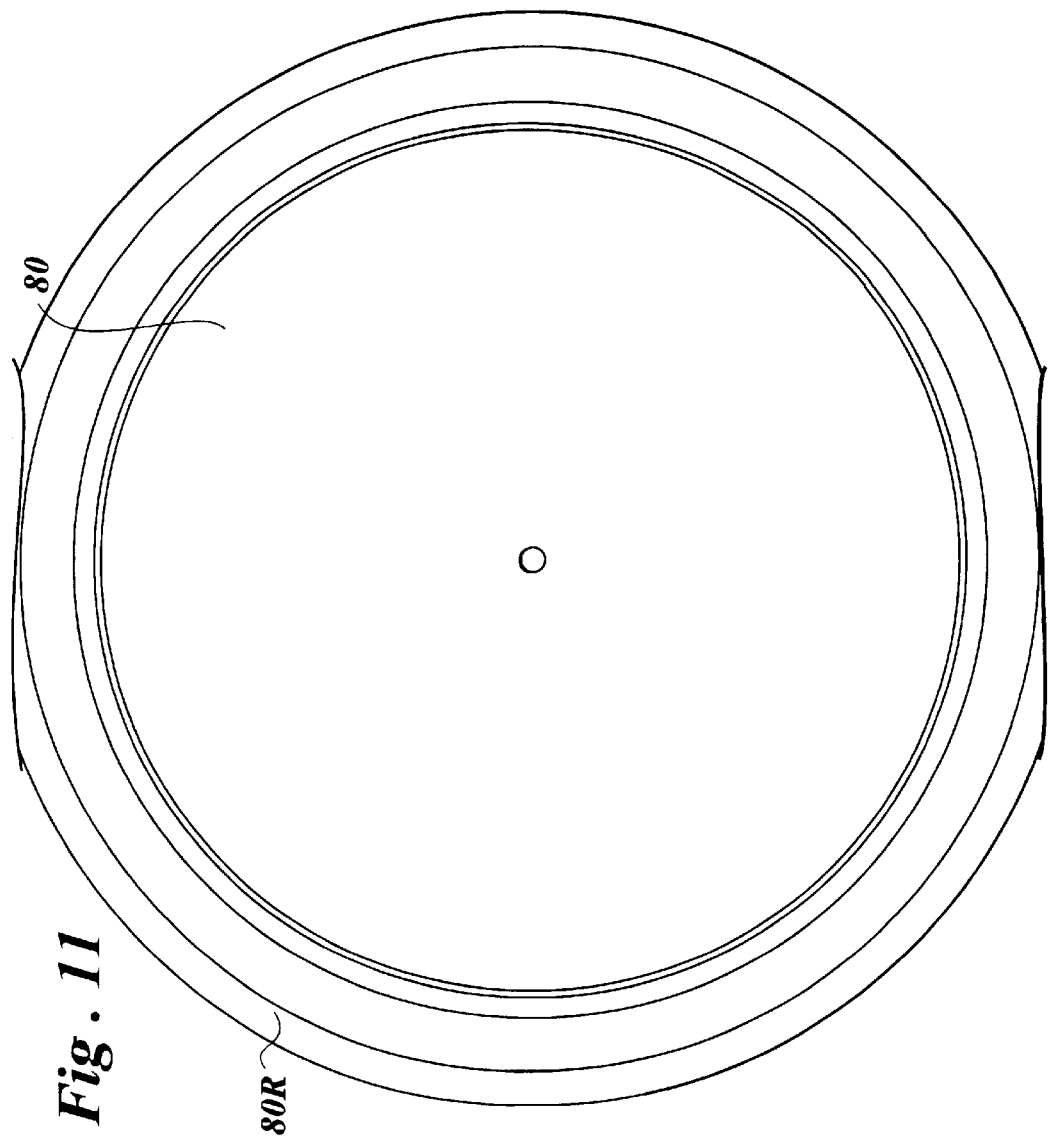
FIG. 11 is plan view of a second common main power source plate of the pressure-contact type semiconductor device.
Figure 12:
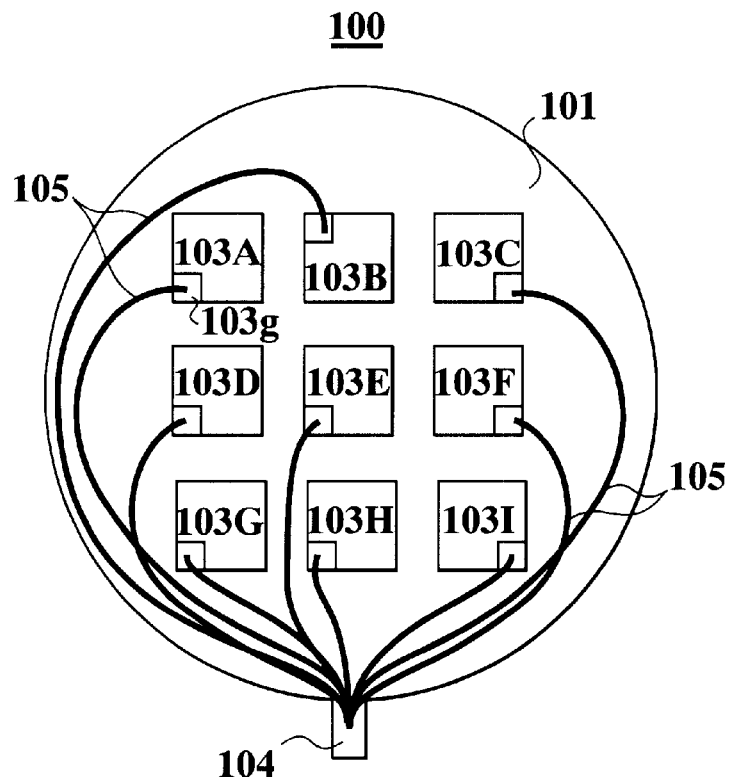
FIG. 12 is a schematic plan view of a pressure-contact type semiconductor device of the related art.
Figure 13:
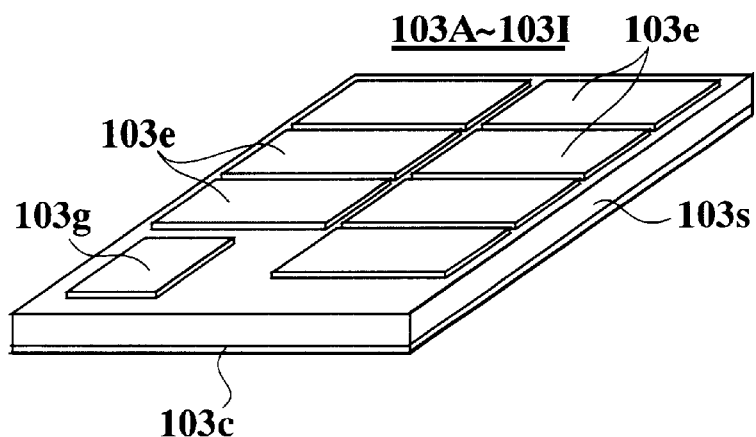
FIG. 13 is a perspective view of the pressure-contact type semiconductor device of FIG. 12.

The second common main power source plate 80 shown in FIGS. 1, 2 and 11 has a contour which is similar to that of the first common main power source plate 10, and not only serves for the semiconductor elements 60 and 61 but also functions as a radiator for radiating heat produced due to the operation of the semiconductor elements 60 and 61. The second common main power source plate 80 has a peripheral edge thereof electrically connected to the second main electrodes 612 of the semiconductor elements 60 via the second heat buffer plate 70, and has the center thereof electrically connected to the electrodes of the semiconductor elements 61.

The second common main power source plate 80 is made of a metallic material similar to that of the first common main power source plate 10, and is machining (mechanical cutting), for example.

A metal ring frame 80R is attached around the second common main power source plate 80. The second common main power source plate 80 is attached to the cylindrical enclosure 15 of the first common main power source plate 10 via the ring frame 80R. Referring to FIG. 1 and FIG. 2, the ring frame 80R is welded to a metal ring frame (of which reference numeral is not shown) provided at the upper part of the cylindrical enclosure 15.

[Features of Pressure-contact type Semiconductor Device]

In the pressure-contact type semiconductor device 1, the semiconductor elements 60 are mounted on the gibbosity electrodes 111 of the first common main power source plate 10 via the conductive metal sheet 40 and the first heat buffer plates 50, and the first main electrodes 610 of the semiconductor elements 60 are electrically connected to the first common main power source plate 10. The semiconductor elements 61 are mounted on the gibbosity electrodes 112 of the first common main power source plate 10 via the conductive metal sheet 40 and the first heat buffer plates 50, and the electrodes of the semiconductor elements 61 are electrically connected to the first common main power source plate 10. Further, the second common main power source plate 80 is arranged on the semiconductor elements 60 and 61 via the second heat buffer plate 70, and the second main electrodes 611 of the semiconductor elements 60 and the electrodes of the semiconductor elements 61 are electrically connected to the second common main power source plate 80. In other words, in the pressure-contact type semiconductor device 1, the semiconductor elements 60 and 61 are sandwiched between the first and second common main power source plates 10 and 80 so as to be electrically conductive. The control signal is sent to the control electrodes 611 of the semiconductor elements 60 via the control signal lead 39 of the gate terminal 15R, the common control signal board 30 and the control signal probes 37.

The common control signal board 30 extends substantially between the rows of semiconductor elements (IGBT) 60, which is effective in reducing wiring resistance and inductance of the control signal transmitting route, and making them uniform. Therefore, the semiconductor elements 60 can operate reliably without malfunction, which enables the pressure-contact type semiconductor device 1 to operate with excellent electrical reliability.

The pressure-contact type semiconductor device 1 can be made compact by providing the common control signal board 30 effectively using spaces between the rows of the semiconductor elements 60.

The common control signal board 30 is constituted by the multi-layered printed circuit, and is assembled into the pressure-contact type semiconductor device 1 as one assembly unit, which improves ease of assembly, and reduces manufacturing and product costs. The common control signal board 30 comprises the insulating film 32A and the thin conductive films 31A to 31D (and insulating films 32B and 32C), and can support the control signal probes 37. No further insulator is required, which is effective in reducing the number of components. Further, the insulating films 32A to 32C are integral with the thin conductive films 31A to 31D, which is effective in simplifying the internal structure of the pressure-contact type semiconductor device 1.

The common control signal board 30 is simply brought into contact with the control electrodes 611 using the control signal probes 37 so that the common control signal board 30 is electrically connected to the semiconductor elements 60. This improves ease and reliability of assembly.

The control signal lead 39 of the gate terminal 15G has the branched ends 391 and 392 in order to reduce the inductance.

The control signal lead 39 also has the control signal connectors 395 and 396 in order to electrically connect to the common control signal board 30 at a plurality of positions, which is effective in reducing the inductance and increasing the current capacity.

The pressure-contact type semiconductor device 1 is assembled without any soldering process, which extensively improves ease of assembly.

(Other Embodiments of Invention)

Although the invention has been described with respect to the preferred embodiment thereof, it will be understood by those skilled in the art that various modifications are possible without departing from the spirit of the present invention.

In the pressure-contact type semiconductor device 1 of the foregoing embodiment, the common control signal board 30 is constituted by the multi-layered printed circuit board. Alternatively the common control signal board 30 may be made of a printed circuit board in which a single thin conductive film is placed on an insulating film. Further, the signal board 30 may be constituted by a multi-layered printed circuit board having two, three, five or more thin conductive films. The conductive films may extend substantially all over the insulating film, or a plurality of conductive film strips may be provided on the same layer.

In the foregoing embodiment, the insulating film 32A is made of glass epoxy resin, and the common control signal board 30 is in the shape of a rigid plate. Alternatively, the insulating film 32A may be made of polyimide resin or the like which is flexible and resistant to heat. Further, the common control signal board 30 may be constituted by a conductive material so long as it is free from electrical shorting with other peripheral components.

According to the invention, the semiconductor element 60 do not always have to be an IGBT, but may be a MOSFET, a SIT, a BJT, a SI thyristor, a GTO thyristor, an IEGT or the like. Further, the pressure-contact type semiconductor device 1 may comprise the same semiconductor elements 60, e.g. the same IGBT.

In the pressure-contact type semiconductor device 1, especially the first and second common main power source plates 10 and 80 do not always have to be disc shaped. Alternatively, they may be square, rectangular, pentagonal or polygonal.

Figure 14:
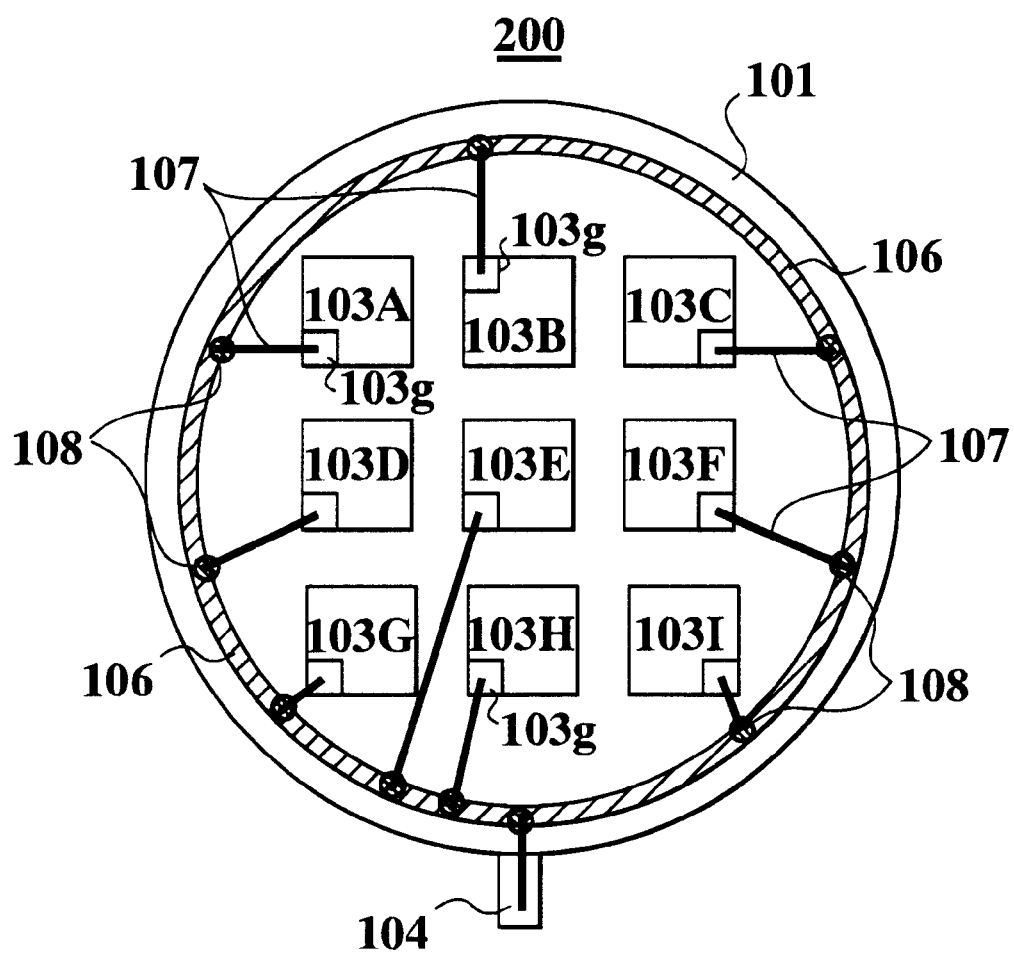
FIG. 14 is a schematic plan view of a further pressure-contact type semiconductor device of the related art.

The gate ring 106 shown in FIG. 14 may be used in the present invention.

As described so far, the invention can provide the pressure-contact type semiconductor device which assures the reliable operation of the semiconductor elements, prevents malfunction, and improve electrical reliability.

The pressure-contact type semiconductor device can be made compact by effective use of spaces between the rows of semiconductor elements.

The invention improves ease and reliability of assembly of the pressure-contact type semiconductor device, which leads to reduction in manufacturing and product costs of the pressure-contact type semiconductor device.

What is claimed is:

1. A pressure-contact type semiconductor device comprising:
    a plurality of semiconductor elements each of which has a first main electrode and a control electrode positioned on a front surface and a second main electrode positioned on a rear surface;
    a second common main power source plate having the semiconductor elements positioned on a front surface and electrically connected to the second main electrodes;
    a first common main power source plate arranged on the front surface of the semiconductor elements and electrically connected to the first main electrodes of the semiconductor elements, said first common main power source plate having first gibbosity electrodes positioned along its peripheral edge, and second gibbosity electrodes positioned at the center thereof; and
    a common control signal board which is in the shape of a mesh sheet and which has electrode openings for the semiconductor elements and which is electrically connected to the control electrodes of the semiconductor elements.

2. The pressure-contact type semiconductor device of claim 1, wherein the electrode openings of the common control signal board are formed in regions where gibbosity electrodes of the first common main power source plate are provided.

3. The pressure-contact type semiconductor device of claim 1, wherein the common control signal board is a printed circuit board having insulating films and thin conductive films on the insulating films.

4. The pressure-contact type semiconductor device of claim 3, wherein the insulating films are made of resin, and the thin conductor films are respectively made of copper or a copper alloy, and plated copper or a plated copper alloy.

5. The pressure-contact type semiconductor device of claim 1 wherein the common control signal board is a multiple-layered printed circuit board in which the insulating films and conductive films are alternately layered.

6. The pressure-contact type semiconductor device of claim 5, wherein the insulating films are made of resin, and the conductor films are respectively made of copper or a copper alloy, and plated copper or a plated copper alloy.

7. The pressure-contact type semiconductor device of claim 5, wherein the layered conductive films are electrically connected via through-holes and through-hole wirings.

8. The pressure-contact type semiconductor device of claim 5, wherein the common control signal board has through-holes and through-hole wirings for connecting control signal probes.

9. The pressure-contact type semiconductor device of claim 5, wherein the semiconductor elements are IGBTs, MOSFETs, SITs, BJTs, SI thyristors, GTO thyristors or IEGTs.

10. The pressure-contact type semiconductor device of claim 9 further comprising a plurality of diode elements.

11. The pressure-contact type semiconductor device of claim 10, wherein the semiconductor elements surround the diode elements.

12. The pressure-contact type semiconductor device of claim 1 further comprising a first heat buffer plate provided between the first common main power source plate and the semiconductor elements, and a second heat buffer plate provided between the second common main power source plate and the semiconductor elements.

13. The pressure-contact type semiconductor device of claim 12, wherein the common control signal board is positioned between the first common main power source plate and the first heat buffer plates.

14. The pressure-contact type semiconductor device of claim 13 further comprising a spacer provided between the first common main power source plate and the common control signal board, and a conductive metal sheet provided between the common control signal board and the first heat buffer plates.

15. The pressure-contact type semiconductor device of claim 5 further comprising control signal probes for electrically connecting the thin conductive films of the common control signal board and the control electrodes of the semiconductor elements.

16. The pressure-contact type semiconductor device of claim 15, wherein connecting portions of the control signal probes between the control signal probes and the control electrodes of the semiconductor elements are in the shape of a hemisphere.

17. The pressure-contact type semiconductor device of claim 5 further comprising a gate terminal for electrically connecting the thin conductive films of the common control signal board to external devices.

18. The pressure-contact type semiconductor device of claim 17, wherein the gate terminal has one end thereof connected to the external devices and includes at the other end thereof a plurality of branched control signal leads electrically connected in parallel.

19. The pressure-contact type semiconductor device of claim 18, wherein the branched control signal leads are provided with connecting-pins for electrical connection with the thin conductive films of the common control signal board.

20. A pressure-contact type semiconductor device comprising:
    a plurality of semiconductor elements each of which has a first main electrode and a control electrode positioned on a front surface and a second main electrode positioned on a rear surface;
    a first common main power source plate arranged on the front surface of the semiconductor elements and electrically connected to the first main electrodes of the semiconductor elements; and
    a second common main power source plate having the semiconductor elements positioned on a front surface and electrically connected to the second main electrodes;
    a common control signal board which is formed by a printed circuit board, and being arranged between rows of the semiconductor elements and along the outside of the semiconductor elements, and being electrically connected to the control electrodes of the semiconductor elements.

21. The pressure-contact type semiconductor device of claim 20, wherein the common control signal board is in the shape of a mesh sheet and has electrode openings for the semiconductor elements.

22. The pressure-contact type semiconductor device of claim 21, wherein the electrode openings of the common control signal board are formed at regions where gibbosity electrodes of the first common main power source plate are provided.

23. The pressure-contact type semiconductor device of claim 20, wherein the common control signal board is a printed circuit board having insulating films and thin conductive films on the insulating films.

24. The pressure-contact type semiconductor device of claim 23, wherein the insulating films are made of resin, and the thin conductor films are made of copper or a copper alloy, or plated copper or a plated copper alloy.

25. The pressure-contact type semiconductor device of claim 20, wherein the common control signal board is a multiple-layered printed circuit board in which the insulating films and conductive films are alternately layered.

26. The pressure-contact type semiconductor device of claim 25, wherein the insulating films are made of resin, and the conductor films are made of copper or a copper alloy, or plated copper or a plated copper alloy.

27. The pressure-contact type semiconductor device of claim 25, wherein the layered conductive films are electrically connected via through-holes and through-hole wirings.

28. The pressure-contact type semiconductor device of claim 25, wherein the common control signal board has through-holes and through-hole wirings for connecting control signal probes.

29. The pressure-contact type semiconductor device of claim 25, wherein the semiconductor elements are IGBTs, MOSFETs, SITs, BJTs, SI thyristors, GTO thyristors, or IEGTs.

30. The pressure-contact type semiconductor device of claim 29, further comprising a plurality of diode elements.

31. The pressure-contact type semiconductor device of claim 30, wherein the semiconductor elements surround the diode elements.

32. The pressure-contact type semiconductor device of claim 20 further comprising a first heat buffer plate provided between the first common main power source plate and the semiconductor elements, and a second heat buffer plate provided between the second common main power source plate and the semiconductor elements.

33. The pressure-contact type semiconductor device of claim 32, wherein the common control signal board is positioned between the first common main power source plate and the first heat buffer plate.

34. The pressure-contact type semiconductor device of claim 33 further comprising a spacer provided between the first common main power source plate and the common control signal board, and a conductive metal sheet provided between the common control signal board and the first heat buffer plate.

35. The pressure-contact type semiconductor device of claim 25 further comprising control signal probes for electrically connecting the thin conductive films of the common control signal board and the control electrodes of the semiconductor elements.

36. The pressure-contact type semiconductor device of claim 35, wherein connecting portions of the control signal probes between the control signal probes and the control electrodes of the semiconductor elements are in the shape of a hemisphere.

37. The pressure-contact type semiconductor device of claim 25 further comprising a gate terminal for electrically connecting the thin conductive films of the common control signal board to external devices.

38. The pressure-contact type semiconductor device of claim 37, wherein the gate terminal has one end thereof connected to the external devices and includes at the other end thereof a plurality of branched control signal leads electrically connected in parallel.

39. The pressure-contact type semiconductor device of claim 38, wherein the branched control signal leads are provided with connecting-pins for electrical connection with the thin conductive films of the common control signal board.

* * * * *